United States Patent [19]
Fujioka

[11] Patent Number: 4,768,915
[45] Date of Patent: Sep. 6, 1988

[54] CHIP FEEDER

[75] Inventor: Teruhiko Fujioka, Shinjuku, Japan

[73] Assignee: Tenryu Technics Co., Ltd., Shizuoka, Japan

[21] Appl. No.: 19,771

[22] Filed: Feb. 26, 1987

[30] Foreign Application Priority Data

Feb. 28, 1986 [JP] Japan .............................. 61-29401[U]

[51] Int. Cl.$^4$ .......................................... H05K 13/04
[52] U.S. Cl. ...................... 414/416; 29/740;
242/55.53; 242/68.3; 226/62; 414/225; 414/403
[58] Field of Search ............... 414/416, 225, 627, 403;
242/55.2, 55.53, 68.3; 226/62, 64, 65, 67, 73,
199; 29/740, 741, 759; 156/344

[56] References Cited

U.S. PATENT DOCUMENTS

| | | |
|---|---|---|
| 2,521,957 | 9/1950 | Wittel et al. ............................ 226/65 |
| 2,720,994 | 10/1955 | Arvidson ............................ 226/64 X |
| 2,889,123 | 6/1959 | Hayden ............................ 242/68.3 |
| 3,270,973 | 9/1966 | Dekker ............................ 226/199 X |
| 3,446,409 | 5/1969 | Stearns ............................ 226/199 X |
| 3,531,057 | 9/1970 | Way ............................ 242/68.3 X |
| 4,437,232 | 3/1984 | Araki et al. ...................... 414/627 X |
| 4,607,774 | 8/1986 | Garr ............................ 242/55.53 X |
| 4,610,083 | 9/1986 | Campisi et al. .................. 414/225 X |

FOREIGN PATENT DOCUMENTS 46334 2/1982 European Pat. Off. ............. 29/740

Primary Examiner—Frank E. Werner
Attorney, Agent, or Firm—Kane, Dalsimer, Sullivan, Kurucz, Levy, Eisele and Richard

[57] ABSTRACT

A chip feeder arranged to intermittently transport a tape having a row of a multiplicity of chip-like electronic parts retained thereon from a tape supply section to a chip takeout section along a guide path. Along the tape guide path are provided a pair of fixed and movable guide plates, a guide width adjusting device and a pitch adjusting device. The guide plates engage both lateral edges, respectively, of the tape being fed so as to guide it. The guide width adjusting device changes the spacing between the two guide plates in accordance with the width of the tape by moving the movable guide plate toward or away from the fixed guide plate. The pitch adjusting device adjusts the tape feed pitch in accordance with the dimensions of chips to be fed. Chips which are transported to the chip takeout section are removed from the tape by means of suction after a protective cover covering the tape has been separated therefrom.

9 Claims, 6 Drawing Sheets

FIG. 2
FIG. 4
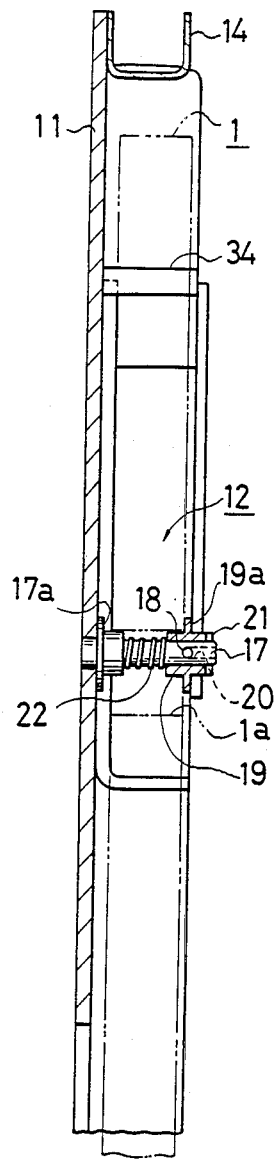
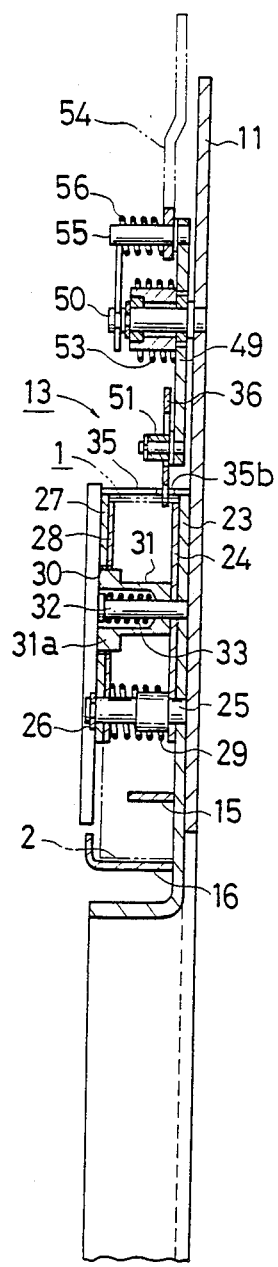

FIG. 8
FIG. 9
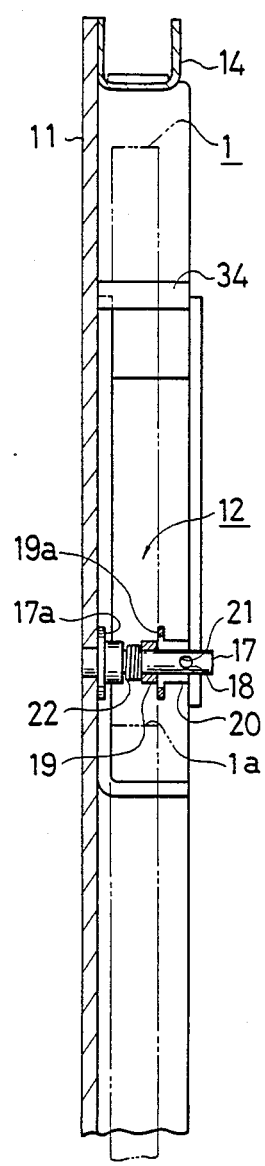
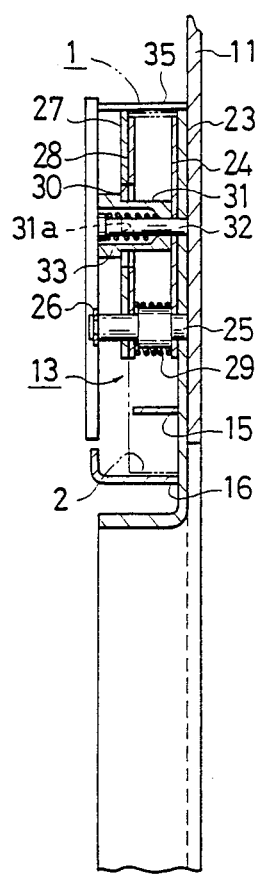

CHIP FEEDER

BACKGROUND OF THE INVENTION

1. Field of the Invention

The present invention relates to a chip feeder which transports a tape having a row of a multiplicity of chip-like electronic parts retained thereon from a tape supply section to a chip takeout section along a guide path.

2. Related Art Statement

A tape which is employed in a chip feeder of the type described above is generally arranged as shown in FIGS. 11 to 13. More specifically, a multiplicity of chips 3 are disposed in a row on a tape body 2, and the surface of this tape body 2 is covered with a protective cover 4 to form a tape 1 which is then reeled and stored in this state.

The reeled tape 1 is loaded on the feeder in which it is intermittently transported from the tape supply section to the chip takeout section by means of traction applied thereto through perforations 5 provided along one lateral edge thereof. At the chip takeout section, the protective cover 4 is separated from the surface of the tape 1 and the chips 3 are removed from the tape body 2 one by one and fed onto a printed-wiring board or the like.

However, as will be clear from FIGS. 11, 13(a) and 13(b), the tapes 1 differ from each other in terms of the tape width and the chip disposition pitch in accordance with the width and length of chips 3. Accordingly, it is conventional practice to prepare feeders which respectively conform to tapes 1 which differ from each other in terms of the width and pitch of chips 3 and use them selectively. Thus, it is inconveniently necessary to provide a large number of different kinds of feeders, and this costs a great deal.

SUMMARY OF THE INVENTION

It is an object of the present invention to provide a chip feeder having general-purpose properties which enable it to handle tapes which differ from each other in terms of the chip width and the chip disposition pitch.

It is another object of the present invention to provide a chip feeder which has a simplified structure and can be produced at reduced costs.

To these ends, the present invention provides a chip feeder comprising: a pair of guide plates provided along the tape guide path in such a manner that the guide plates engage both lateral edges, respectively, of a tape being transported so as to guide it; guide width adjusting means for adjusting the width of the guide path by moving one of the guide plates toward or away from the other in accordance with the width of the tape; and pitch adjusting means for adjusting the tape feed pitch provided in the vicinity of the guide path.

Accordingly, the chip feeder according to the present invention enables one guide plate to move toward or away from the other guide plate by operating the guide width adjusting means, thereby allowing the guide spacing between the two guide plates to be readily changed in accordance with the width of a tape which is to be handled. Further, the tape feed pitch can be changed in accordance with the pitch of chips disposed in a row on the tape by operating the pitch adjusting means. Accordingly, it is possible to handle tapes which differ from each other in terms of the tape width and the chip disposition pitch without the need to prepare a multiplicity of different kinds of feeders. In addition, the feeder according to the present invention has a simplified structure and can be produced at reduced costs.

BRIEF DESCRIPTION OF THE DRAWINGS

The above and other objects, features and advantages of the present invention will become more apparent from the following description of a preferred embodiment thereof taken in conjunction with the accompanying drawings, in which:

FIG. 2 is a fragmentary enlarged sectional view taken along the line A—A of FIG. 1;

FIG. 4 is a fragmentary enlarged sectional view taken along the line B—B of FIG. 1;

FIG. 8 is a fragmentary sectional view corresponding to FIG. 2;

FIG. 9 is a fragmentary sectional view corresponding to FIG. 4, which illustrates the way in which a tape having a relatively small width is guided;

DETAILED DESCRIPTION OF THE PREFERRED EMBODIMENT

Figure 1:
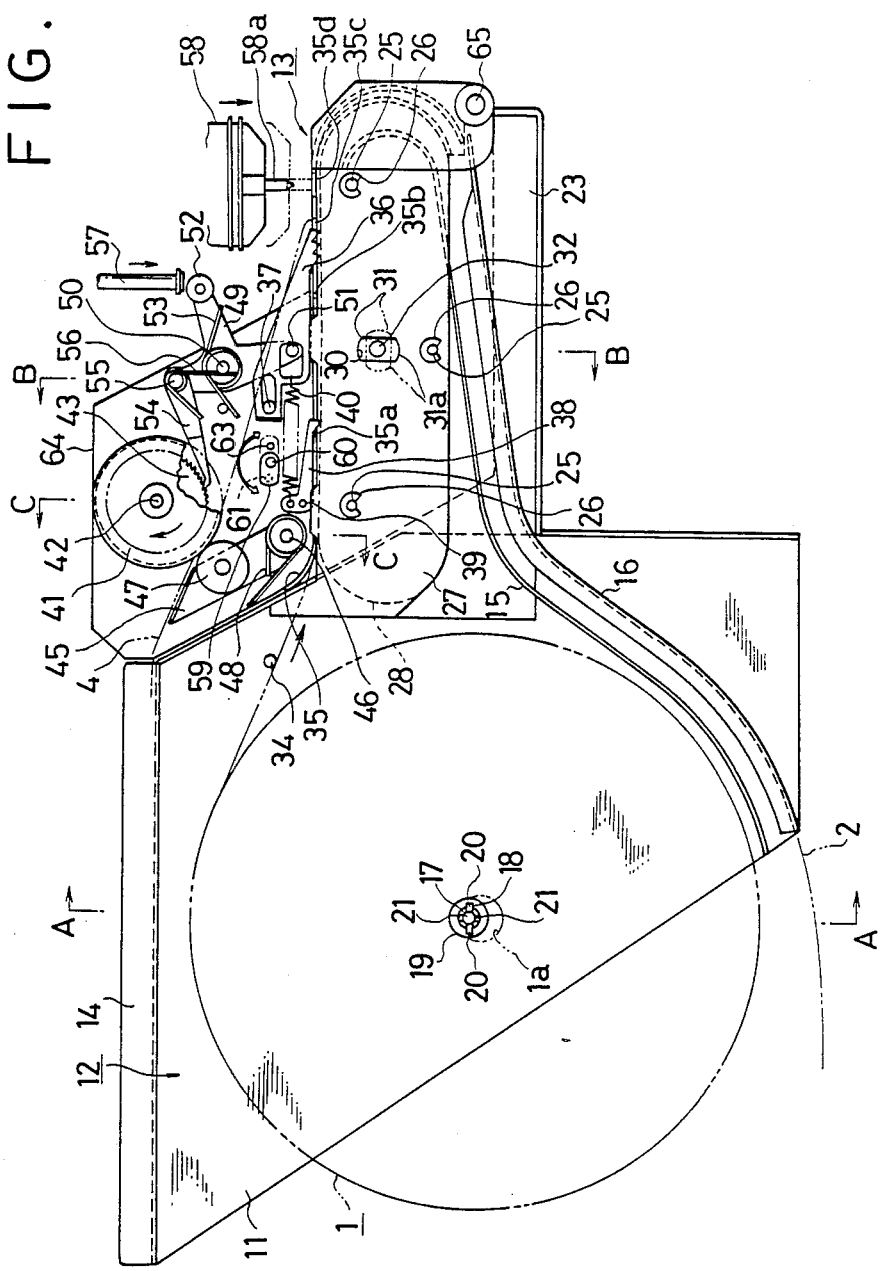
FIG. 1 is a plan view of one embodiment of the chip feeder of the present invention.
Figure 11:
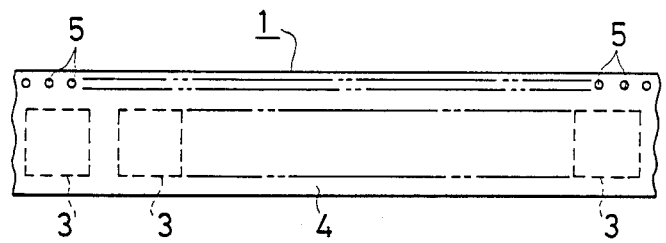
FIG. 11 is a fragmentary front view of one example of a tape employed in a chip feeder.
Figure 12:
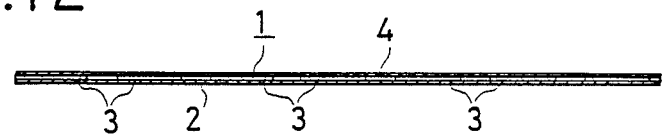
FIG. 12 is a longitudinal sectional view of the tape shown in FIG. 11.

Referring to the drawings, the chip feeder in accordance with one embodiment of the present invention has a frame 11 having a substantially flat plate-like configuration, and a tape supply section 12 is provided on the front side of the left-hand part of the frame 11 as shown in FIG. 1. The tape supply section 12 is arranged so that a reeled tape 1 can be loaded thereon, the tape 1 having a row of a multiplicity of chips 3 retained thereon as shown in FIGS. 11 to 13. A chip takeout section 13 is provided on the front side of the right-hand part of the frame 11. At the chip takeout section 13, a protective cover 4 is separated from the tape 1 which is transported thereto from the tape supply section 12, and the chips 3 are removed one by one from the tape 1.

A discharge gutter 14 is provided on the front side of the frame 11 in such a manner that the gutter 14 extends horizontally above the tape supply section 12. Thus, the protective cover 4 which is separated from the tape 1 is discharged through the gutter 14. A partition plate 15 and a guide plate 16 are provided on the front side of the lower part of the frame 11 in such a manner that the plates 15 and 16 extend from the chip takeout section 13 to the tape supply section 12. Thus, the tape body 2 having the chips 3 removed therefrom in the chip takeout section 13 is discharged while being guided through the path defined between the partition plate 15 and the guide plate 16.

The arrangement of the tape supply section 12 will be described below in detail.

Figure 3:
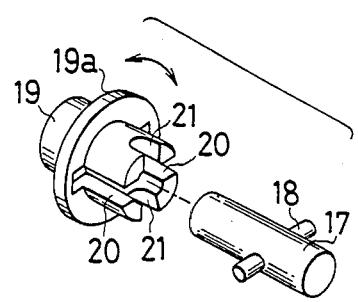
FIG. 3 is a fragmentary enlarged exploded perspective view of the tape support structure in the tape supply section.

Referring to FIGS. 1 to 3, a stepped support shaft 17 is provided on the frame 11 so as to project from the front side thereof. A flange 17a is formed at the proximal portion of the shaft 17, and an engagement pin 18 projects from the outer periphery of the distal end of the shaft 17. A tubular support member 19 is fitted on the support shaft 17 so as to be supported thereby in such a manner that the support member 19 is rotatable and movable axially, the support member 19 having a flange 19a formed on the outer periphery thereof. A pair of engagement grooves 20 and 21 which define in combination a cross-shaped groove are formed in the distal end surface of the support member 19 in such a manner that the grooves 20 and 21 are selectively engageable with the engagement pin 18, one engagement groove 20 being deeper than the other engagement groove 21. A spring 22 is interposed between the step portion of the support shaft 17 and the tubular support member 19 so as to bias the support member 19 forwardly.

When the tubular support member 19 is turned to a position where the engagement pin 18 is engaged with the deeper engagement groove 20 as shown in FIGS. 1 and 2, the spacing between the flanges 17a and 19a is increased, so that a central fitting bore 1a provided in a reeled tape 1 having a relatively large width, such as that shown in FIG. 11, can be fitted on the support shaft 17 and the tubular support member 19 so that the tape 1 is supported thereby. On the other hand, when the tubular support member 19 is turned to a position where the engagement pin 18 is engaged with the shallower engagement groove 21 as shown in FIG. 8, the spacing between the flanges 17a and 19a is decreased, so that a reeled tape 1 having a relatively small width, such as that shown in FIG. 13(a), can be fitted on and supported by the support shaft 17 and the tubular support member 19.

The arrangement of the chip takeout section 13 will next be described in detail.

As shown in FIGS. 1 and 4, the guide path of the tape 1 which is delivered from the tape supply section 12 is partly defined by a fixed guide plate 23 which is secured to the front side of the right-hand part of the frame 11. A substantially track-shaped guide plate member 24 is provided on the front side of the fixed guide plate 23. Three stepped support pins 25 project from the front side of the guide plate member 24, and stop rings 26 are respectively attached to the distal ends of the support pins 25. A movable guide plate 27 is supported by the support pins 25 which extend through the guide plate 27 so that the movable guide plate 27 is positioned in the front of the guide plate member 24 and movable in the longitudinal direction of the support pins 25. The rear side of the movable guide plate 27 is provided with a guide plate member 28 having the same shape as that of the guide plate member 24 provided on the fixed guide plate 23. Springs 29 are respectively wound around the support pins 25 to bias both the movable guide plate 27 and the guide plate member 28 forwardly, that is, in a direction in which they move away from the fixed guide plate 23.

Figure 5:
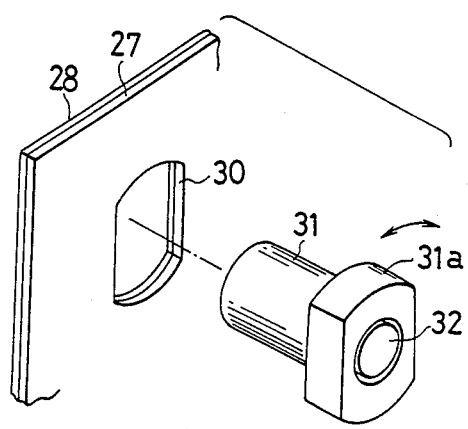
FIG. 5 is a fragmentary enlarged exploded perspective view of the structure for moving the movable guide plate for the purpose of adjusting the width of the guide path.

As shown in FIGS. 1, 4 and 5, substantially oval through-holes 30 are formed in the respective centers of the movable guide plate 27 and the guide plate member 28. An adjuting member 31 is rotatably and axially movably supported through a pin 32 on the front side of the guide plate member 24 provided on the fixed guide plate 23 so that the adjusting member 31 faces the through-holes 30. A substantially oval engagement projection 31a which is slightly smaller than the through-holes 30 is formed at the distal end of the adjusting member 31. A spring 33 having a stronger resilient force than that derived from the springs 29 on the support pins 25 is wound around the pin 32 to bias the adjusting member 31 rearwardly, that is, in a direction in which both the movable guide plate 27 and the guide plate member 28 move toward the fixed guide plate 23.

When the adjusting member 31 is turned to a position where the engagement projection 31a is coincident with the through-holes 30 as shown in FIGS. 1 and 4, the movable guide plate 27 and the guide plate member 28 are disposed relatively away from the fixed guide plate 23 and the guide plate member 24, so that it is possible to guide a tape 1 having a relatively large width, such as that shown in FIG. 11, along the respective outer peripheral surfaces of the guide plate members 24 and 28 while limiting the lateral movement of the tape 1 by the guide plates 23 and 27. On the other hand, when the adjusting member 31 is turned to a position where the engagement projection 31a is not coincident with the through-holes 30 and the movable guide plate 27 is thereby enagaged with the rear end edge of the engagement projection 31a as shown by the chain line in FIG. 1 and also in FIG. 9, the movable guide plate 27 and the guide plate member 28 are disposed relatively close to the fixed guide plate 23 and the guide plate member 24, so that it is possible to guide a tape 1 having a relatively small width, such as that shown in FIG. 13(a).

Referring to FIGS. 1, 2 and 8, a guide pin 34 is provided so as to project from the front side of the frame 11 at an intermediate position between the tape supply section 12 and the chip takeout section 13 for the purpose of guiding the tape 1 delivered from the tape supply section 12 into the guide path defined between the guide plates 23 and 27.

Figure 10:
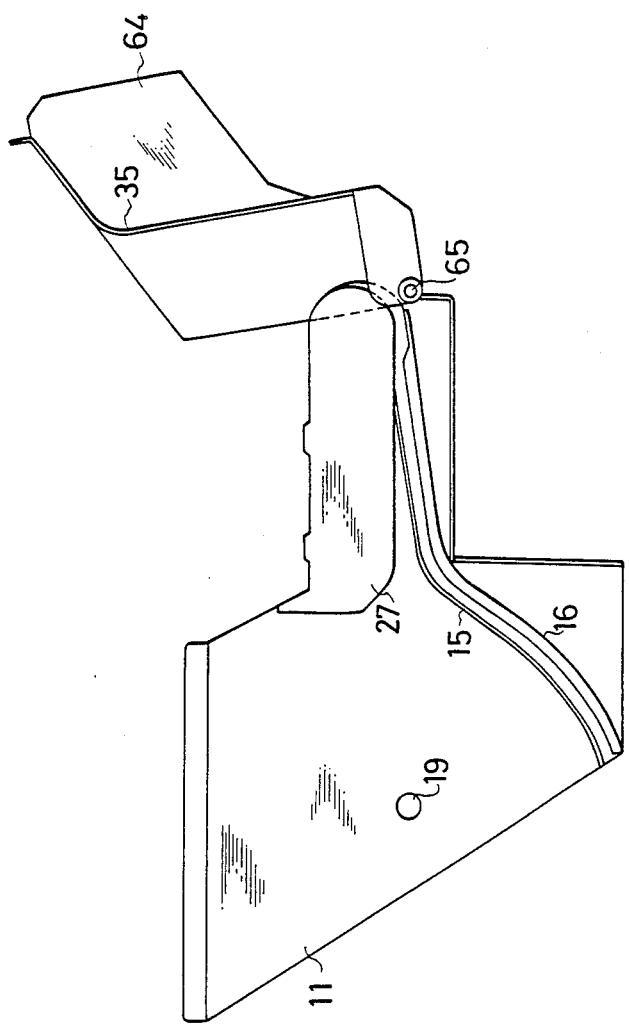
FIG. 10 is a front view of a part of the embodiment in a state wherein the support plate is in a pivoted position.

As shown in FIGS. 1 and 10, a support plate 64 is pivotally supported through a shaft 65 at the forward, or right-hand end (as viewed in FIG. 1), of the fixed guide plate 23. A regulating plate 35 is disposed on the support plate 64 in such a manner that the plate 35 extends from a position above and to the right of the guide pin 34 along the upper ends and right-hand edges of the guide plate members 24 and 28, thus preventing the tape 1 from rising from the guide path defined between the guide plates 23 and 27. The regulating plate 35 is provided with a pair of right and left pawl receiving openings 35a, 35b, a cover delivery port 35c and a chip takeout port 35d.

As will be clear from FIGS. 1 and 4, a feed pawl 36 is supported through a pin 37 on the front side of the support plate 64 at a position above the regulating plate 35 in such a manner that the feed pawl 36 is horizontally movable through a slot, and a pawl portion formed at the distal end of the feed pawl 36 extends through the pawl receiving opening 35b in the regulating plate 35 so as to engage perforations 5 which are provided in the tape 1. A reverse feed preventing pawl 38 is pivotally supported through a pin 39 on the front side of the support plate 64 at a position to the left of the feed pawl 36 as viewed in FIG. 1, and a pawl portion formed at the distal end of the pawl 38 extends through the pawl receiving opening 35a in the regulating plate 35 so as to engage one of the perforations 5 provided in the tape 1. A spring 40 is stretched between the feed pawl 36 and the reverse feed preventing pawl 38 to bias the feed pawl 36 leftwardly and also bias the reverse feed preventing pawl 38 so as to pivot clockwise as viewed in FIG. 1. As the feed pawl 36 reciprocates horizontally, the tape 1 is intermittently fed rightward while being prevented from being fed reversely, that is, leftwardly, by means of the reverse feed preventing pawl 38.

Figure 6:
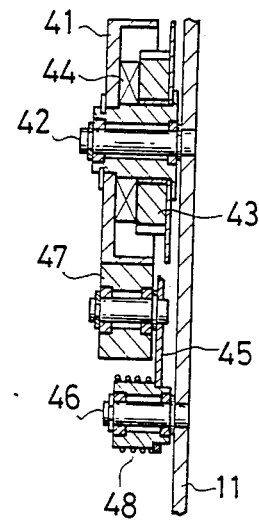
FIG. 6 is a fragmentary enlarged sectional view taken along the line C—C of FIG. 1.

As shown in FIGS. 1 and 6, a delivery roller 41 is rotatably supported through a pin 42 on the front side of the support plate 64 at a position above the reverse feed preventing pawl 38. A ratchet wheel 43 is fitted on the tubular shaft portion of the delivery roller 41 so that the wheel 43 is rotatable relative to said shaft portion. The arrangement is such that the clockwise rotation of the ratchet wheel 43 alone is transmitted to the delivery roller 41 through a one-way clutch 44. An oscillating lever 45 is pivotally supported through a pin 46 on the front side of the support plate 64 at a position near the delivery roller 41, and a pressure roller 47 is rotatably supported on the front side of the distal end of the lever 45 in such a manner that the roller 47 is in contact with the roller 41. A spring 48 is stretched between the lever 45 and the regulating plate 35 to bias the lever 45 so as to pivot clockwise as viewed in FIG. 1. Thus, the protective cover 4 which is separated from the surface of the tape 1 and drawn out upward from the cover delivery port 35c provided in the regulating plate 35 is passed through the area between the delivery roller 41 and the pressure roller 47 and transported to the discharge gutter 14 in response to the rotation of the roller 41.

As shown in FIGS. 1 and 4, an actuating lever 49 consisting of three arm portions is pivotally supported through a pin 50 on the front side of the support plate 64 at a position above the feed pawl 36. One of the arm portions of the lever 49 is provided with an engagement pin 51 which projects therefrom so as to engage a slot provided in the feed pawl 36. A press roller 52 is rotatably supported by another arm portion of the lever 49. A spring 53 is stretched between the actuating lever 49 and the support plate 64 to bias the lever 49 to pivot counterclockwise as viewed in FIG. 1. A ratchet 54 is pivotally supported through a pin 55 by the remaining arm portion of the lever 49 and biased by the action of a spring 56 so as to pivot in a direction in which it engages the ratchet wheel 43.

As shown in FIG. 1, a press rod 57 is disposed above the press roller 52 so as to be able to reciprocate vertically, and reciprocated at a predetermined timing by the operation of a drive unit (not shown). In response to the reciprocating movement of the press rod 57, the actuating lever 49 is reciprocatively pivoted through the press roller 52, and the feed pawl 36 is thereby reciprocated horizontally through the engagement pin 51, thus causing the tape 1 to be fed intermittently and also the delivery roller 41 to be intermittently rotated through the ratchet 54, the ratchet wheel 43 and the one-way clutch 44 in order to transport the protective cover 4.

A chip takeout member 58 is disposed above the chip takeout port 35d in the regulating plate 35 so as to be able to reciprocate vertically, and reciprocated together with the press rod 57 in one unit by the operation of the above-described drive unit. When the chip takeout member 58 is lowered, a suction nozzle 58a provided at the lower end of the chip takeout member 58 extends through the chip takeout port 35b in the regulating plate 35 so as to face one of the chips 3 retained on the tape 1. In this state, the chips 3 are removed one by one from the surface of the tape body 2 by means of suction force generated when air is sucked into the suction nozzle 58a, and the chips 3 are then fed onto a printed-wiring board or the like (not shown).

Figure 7:
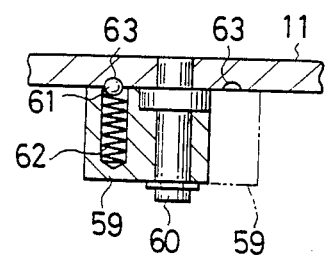
FIG. 7 is a fragmentary enlarged sectional view illustrating the way in which the stopper for the feed pawl is mounted.

As shown in FIGS. 1 and 7, a stopper 59 is pivotally supported through a pin 60 on the front side of the support plate 64 at a position to the left of the feed pawl 36 so as to limit the amount of feed of the tape 1 through engagement with the left end of the feed pawl 36. An engagement ball 61 and a spring 62 are provided on the rear side of the stopper 59, the ball 61 being selectively engaged with a pair of right and left positioning recesses 63 formed in the front side of the frame 11 to thereby position and retain the stopper 59 at either the left-hand position shown by the solid line in FIGS. 1 and 7 or the right-hand position shown by the chain line. When the stopper 59 is disposed at the left-hand position, the amount of reciprocating movement of the feed pawl 36 is increased, so that a tape 1 retaining chips 3 whose dimension measured in the direction of row of perforations 5 is relatively large, such as that shown in FIG. 13(a), can be fed intermittently at a relatively large feed per stroke. When the stopper 59 is disposed at the right-hand position, the amount of reciprocating movement of the feed pawl 36 is decreased, so that a tape 1 retaining chips 3 whose dimension measured in the direction of row of perforations 5 is relatively small, such as that shown in FIG. 13(b), can be fed intermittently at a relatively small feed per stroke.

The following is a description of the operation of the chip feeder arranged as detailed above.

When a tape 1 retaining chips 3 whose dimensions respectively measured in the direction of row of perforations 5 and in the direction perpendicular to said direction are relatively large, such as that shown in FIGS. 11 and 12, is to be handled by the chip feeder, the engagement pin 18 provided on the support shaft 17 is engaged with the deeper engagement groove 20 formed in the tubular support member 19 provided in the tape supply section as shown in FIG. 2 to increase the spacing between the flanges 17a and 19a, and in this state, the central fitting bore 1a in the reeled tape 1 is fitted on the support shaft 17 and the tubular support member 19 so that the tape 1 is supported thereby. Further, the engagement projection 31a of the adjusting member 31 provided in the chip takeout section 13 is made coincident with the through-holes 30 as shown in FIG. 4 to increase the spacing between the guide plates 23 and 27, and in this state, the tape 1 which is delivered from the tape supply section 12 is extended rightwardly (as viewed in FIG. 1) along the upper end edges of the guide plate members 24, 28 and through the guide path defined between the guide plates 23, 27. The protective cover 4 which is separated from the surface of the tape 1 is drawn out upwardly from the cover delivery port 35c provided in the regulating plate 35, and the leading end of the protective cover 4 is inserted into the area between the delivery roller 41 and the pressure roller 47. In addition, the stopper 59 is pivoted to the left-hand position shown by the solid line in FIG. 1.

In this state, the chip feeder is activated. In consequence, the press rod 57 and the chip takeout member 58 are reciprocated vertically at a predetermined timing by the operation of the drive unit (not shown). In response to the reciprocating movement of the press rod 57, the feed pawl 36 is reciprocated horizontally through the actuating lever 49, thus causing the tape 1 to be intermittently fed rightward. In addition, the delivery roller 41 is rotated intermittently through the actuating lever 49, the ratchet 54, the ratchet wheel 43, etc., and the protective cover 4 is thereby separated from the surface of the tape 1 and discharged onto the discharge gutter 14. Further, when the chip takeout member 58 is lowered, air is sucked into the suction nozzle 58a to generate suction force by which the chips 3 are removed one by one from the surface of the tape body 2 and then transferred onto a printed-wiring board or the like (not shown). The tape body 2 having the chips 3 removed therefrom is transported along the guide plate 16 and discharged to the lower side of the tape supply section 12.

Figure 13A:
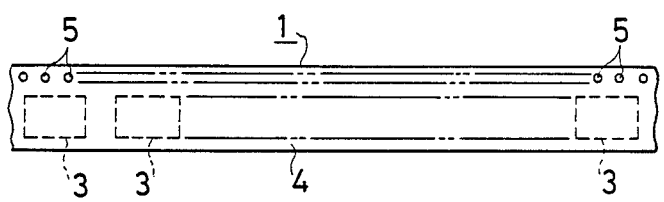
FIGS. 13(a) and 13(b) are fragmentary front views respectively illustrating tapes having different arrangements.

When a relatively narrow tape 1 retaining chips 3 whose dimension measured in the direction perpendicular to the direction of row of perforations 5 is small, such as that shown in FIG. 13(a), is to be handled, the engagement pin 18 provided on the support shaft 17 is engaged with the shallower engagement groove 21 formed in the tubular support member 19 provided in the tape supply section 12 as shown in FIG. 8 to decrease the spacing between the flanges 17a and 19a, and in this state, the reeled tape 1 is fitted on the support shaft 17 and the tubular support member 19 so as to be supported thereby. Further, the adjusting member 31 in the chip takeout section 13 is turned to a position where the engagement projection 31a is not coincident with the through-holes 30 and the movable guide plate 27 is engaged with the rear end edge of the engagement projection 31a as shown in FIG. 9 to decrease the spacing between the guide plates 23 and 27, and in this state, the tape 1 delivered from the tape supply section 12 is extended rightwardly while being guided through the path defined between the guide plates 23 and 27 in a manner similar to that in the above. In addition, the protective cover 4 is similarly drawn out from the cover delivery port 35c, and the leading end of the cover 4 is inserted into the area between the delivery roller 41 and the pressure roller 47.

When, in this state, the chip feeder is activated, the intermittent feed of the tape 1, the separation of the protective cover 4 and the takeout of the chips 3 are effected in a manner similar to that in the above-described operation. Accordingly, when there is a change in the width of the tape 1 which is to be handled, it is unnecessary to replace the whole of the chip feeder with another kind of feeder, and it is possible to alter the tape supporting width at the tape supply section 12 and the width of the guide path in the chip takeout section 13 by a simple adjusting operation and to resume the operation quickly.

Figure 13B:
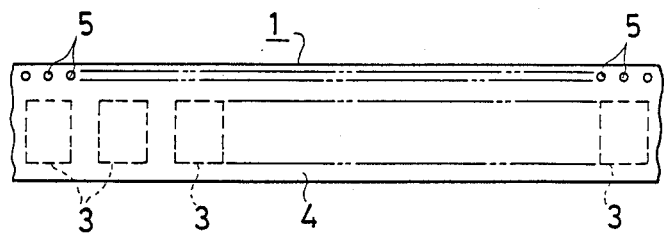

When a tape 1 retaining chips 3 whose dimension measured in the direction of row of perforations 5 is relatively small, such as that shown in FIG. 13(b), is to be handled, the stopper 59 is pivoted to the right-hand position shown by the chain line in FIGS. 1 and 7. When, in this state, the chip feeder is activated, the amount of reciprocating movement of the feed pawl 36 is relatively small, so that the tape 1 is fed intermittently at a relatively small feed per stroke. Accordingly, when there is a change in the amount of feed of the tape 1, it is also possible to readily cope with such change by a simple adjusting operation.

As described above, in the chip feeder in accordance with this embodiment, the guide width and the feed pitch each can be adjusted to two selective levels in conformity with the width of the tape 1 to be handled and the pitch of chips disposed in a row on the tape 1, and therefore the chip feeder can handle four different kinds of tape.

In the chip feeder in accordance with this embodiment, the tape guide section can be exposed by pivoting the support plate 64 as shown in FIG. 10, thus facilitating change of tapes 1 and cleaning of the guide section. Since the feed of the tape 1 is effected by the movement of the press rod 57 which operates together with the chip takeout member 58 in one unit, there is no need for a drive unit for feeding the tape 1, and the feed of the tape 1 and the action of the chip takeout member 58 can reliably be synchronized with each other, which means that there is no fear of a chip 3 failing to be suction-held by the chip-takeout member 58.

It should be noted that the present invention is not necessarily limited to the above-described embodiment and the arrangement of each part or member may be changed or modified as desired without departing from the scope and spirit of the present invention. For example, a pivotal eccentric cam may be provided in place of the stopper 59 in order to enable stepless adjustment of the feed pitch, and the arrangement of the guide width adjusting means may also be changed.

As has been described in detail above, the present invention enables one guide plate to move toward or away from the other guide plate by operating the guide width adjusting means, thereby allowing the guide spacing between the two guide plates to be readily changed in accordance with the width of a tape which is to be handled. Further, the tape feed pitch can be changed in accordance with the pitch of chips disposed in a row on the tape by operating the pitch adjusting means. Accordingly, it is possible to handle tapes which differ from each other in terms of the tape width and the chip disposition pitch without the need to prepare a multiplicity of different kinds of feeders. In addition, the feeder according to the present invention has a simplified structure and can be produced at reduced costs.

What is claimed is:

1. A chip feeder arranged to intermittently transport a tape having a row of a multiplicity of chips retained thereon from a tape supply section to a chip takeout section along a guide path, said feeder comprising:
   a frame;
   a pair of guide plates respectively defined by a fixed guide plate disposed on said frame provided on one side of said tape guide path in the chip takeout section and a moveable guide plate provided on the other side of said tape guide path, said moveable guide plate being moveable toward and away from said fixed guide plate, and said moveable guide plate being biased by resilient means in a direction in which said moveable guide plate moves from said fixed guide plate, said guide plates being provided along said tape guide path in such a manner that said guide plates engage both lateral edges, respectively, of said tape being transported so as to guide said tape;
   said fixed and moveable guide plates having respectively guide plates members disposed on their opposing sides;
   guide width adjusting means for adjusting the width of said guide path by moving one of said guide plates toward or away from the other guide plate in accordance with the width of said tape;

said guide width adjusting means comprises aligned through-holes which are respectively formed in said moveable guide plate, and the guide plate member provided on said moveable guide plate, an adjusting member supported through a pin on the guide plate member provided on said fixed guide plate at a position where said adjusting member matches said through-holes in such a manner that said adjusting member is rotatable and axially moveable, an engagement projection provided at the distal end of said adjusting member and adapted such that, when said projection is matched with said through-holes, sid projection passes through said through-holes to increase the spacing between said two guide plates, whereas, when said engagement projection is not matched with said through-holes, said engagement engages with the outer surface of said movable guide plate to thereby decrease the spacing between said two guide plates, and a second resilient means for biasing said adjusting member toward said fixed guide plate with a stronger resilient force than that applied by said resilient means; and, pitch adjusting means for adjusting the tape feed pitch provided in the vicinity of said guide path.

2. A chip feeder according to claim 1, wherein said through-holes and said engagement projection have substantially the same configuration as each other, said engagement projection having outer dimensions slightly smaller than the inner dimensions of said through-holes.

3. A chip feeder according to claim 1, wherein said tape supply section has second guide width adjusting means which comprises a stepped support shaft projecting from one side surface of a frame of said feeder, an engagement pin provided at the distal end of said support shaft, a tubular support member fitted on said support shaft so as to be supported thereby in such a manner that said support member is rotatable and axially movable, a pair of engagement grooves formed in the distal end surface of said tubular support member so as to be selectively engageable with said engagement pin, one of said engagement grooves being deeper than the other, and resilient means interposed between a step portion of said support shaft and said tubular support member, said second guide width adjusting means being arranged such that, when said engagement pin is engaged with the deeper engagement groove in response to the rotation of said tubular support member, the spacing between a flange of said support shaft and a flange of said tubular support member is increased, whereas, when said engagement pin is engaged with the shallower engagement groove, the spacing between said two flanges is decreased.

4. A chip feeder according to claim 3, wherein said pair of engagement grooves are disposed in the distal end surface of said tubular support member so as to define in combination a cross-shaped groove.

5. A chip feeder according to claim 1, wherein said chip takeout section includes chip takeout means for taking out the chips retained in a row on said tape after a protective cover has been separated from the body of said tape.

6. A chip feeder arranged to intermittently transport a tape having a row of multiplicity of chips retained thereon from a tape supply section to a chip takeout section along a guide path, said feeder comprising:

a frame;

a pair of guide plates provided along said tape guide path in such a manner that said guide plates engage both lateral edges, respectively, of said tape being transported so as to guide said tape;

guide width adjusting means for adjusting the width of said guide path by moving one of said guide plates toward or away from the other guide plate in accordance with the width of said tape; and pitch adjusting means provided in the vicinity of said guide path defined by a stopper adapted to engage feed means for advancing said tape in order to limit the amount of feed of said tape, said stopper is pivotally secured to said frame and provided on one side of said tape guide path in said chip takeout section and said stopper has an engagement ball which is selectively engaged with a pair of positioning recesses provided in one side surface of said frame in response to the pivotal movement of said stopper, and biasing means for resiliently pressing said engagement ball against either one of said positioning recesses.

7. A chip feeder according to claim 6, wherein said tape supply section has a second guide width adjusting means which comprises a stepped support shaft projecting from one side surface of a frame of said feeder, an engagement pin provided at the distal end of said support shaft, a tubular support member fitted on said support shaft so as to be supported thereby in such a manner that said support member is rotatable and axially moveable, a pair of engagement grooves formed in the distal end surface of said tubular support member so as to be selectively engageable with said engagement pin, one said engagement grooves being deeper than the other, and resilient means interposed between a step portion of said support shaft and said tubular support member, said second guide width adjusting means being arranged such that, when said engagement pin is engaged with the deeper engagement groove in response to the rotation of said tubular support member, the spacing between a flange of said support shaft and a flange of said tubular support member is increased, whereas, when said engagement pin is engaged with the shallower engagement groove, the spacing between said two flanges is decreased.

8. A chip feeder according to claim 7 wherein said pair of engagement grooves are disposed in the distal end surface of said tubular support member so as to define in combination a cross-shaped groove.

9. A chip feeder according to claim 6, wherein said chip takeout section includes chip takeout means for taking out the chips retained in a row on said tape after a protective cover has been separated from the body of said tape.

* * * * *